(12) United States Patent
Gu

(10) Patent No.: US 11,290,104 B2
(45) Date of Patent: Mar. 29, 2022

(54) DRIVING CIRCUIT

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/374,999

(22) Filed: Jul. 14, 2021

(65) Prior Publication Data

US 2022/0045675 A1 Feb. 10, 2022

Related U.S. Application Data

(63) Continuation of application No. PCT/CN2021/076150, filed on Feb. 9, 2021.

(30) Foreign Application Priority Data

Aug. 7, 2020 (CN) .......................... 202010787892.X

(51) Int. Cl.
*H03B 1/00* (2006.01)
*H03K 3/00* (2006.01)
*H03K 17/567* (2006.01)
*G11C 11/4076* (2006.01)

(52) U.S. Cl.
CPC ........ *H03K 17/567* (2013.01); *G11C 11/4076* (2013.01)

(58) Field of Classification Search
CPC .......................... H03K 17/567; G11C 11/4076
USPC .......................................................... 327/109
See application file for complete search history.

(56) References Cited

U.S. PATENT DOCUMENTS

2011/0001510 A1* 1/2011 Kim .................... H03K 19/0005
326/30

FOREIGN PATENT DOCUMENTS

JP 2015186071 A * 10/2015

* cited by examiner

*Primary Examiner* — Metasebia T Retebo
(74) *Attorney, Agent, or Firm* — Syncoda LLC; Feng Ma

(57) ABSTRACT

A driving circuit includes: a primary driving module configured to receive a first signal and generate a second signal based on the first signal, driving capability of the second signal being greater than that of the first signal; and an auxiliary driving module connected to an output terminal of the primary driving module and configured to receive the first signal and generate an auxiliary driving signal based on the first signal, the auxiliary driving signal being configured to shorten a rise time of the second signal.

16 Claims, 4 Drawing Sheets

DRIVING CIRCUIT

CROSS-REFERENCE TO RELATED APPLICATIONS

This application is a continuation of International Patent Application No. PCT/CN2021/076150 filed on Feb. 9, 2021, which claims priority to Chinese Patent Application No. 202010787892.X filed on Aug. 7, 2020. The disclosures of these applications are hereby incorporated by reference in their entirety.

BACKGROUND

With the continuous development of mobile devices, battery-powered mobile devices, such as mobile phones, tablet computers and wearable devices, are increasingly popular. As an essential element of a mobile device, a memory device with a high-speed and low-power storage function is in great demand.

SUMMARY

The present disclosure relates generally to the field of semiconductor device technologies, and more specifically to a driving circuit.

One aspect of the present disclosure provides a driving circuit, including:

a primary driving module configured to receive a first signal and generate a second signal based on the first signal, driving capability of the second signal being greater than that of the first signal; and an auxiliary driving module connected to an output terminal of the primary driving module and configured to receive the first signal and generate an auxiliary driving signal based on the first signal, the auxiliary driving signal being configured to shorten a rise time of the second signal.

Another aspect of the present disclosure provides a driving circuit, including:

a second pull-up transistor configured to generate an auxiliary driving signal and output the auxiliary driving signal to a primary driving module, the auxiliary driving signal being configured to shorten a rise time of an output signal of the primary driving module;

a periodic clock generation component configured to generate a clock signal with a duty ratio of 50%; and an edge enhancement unit connected to the periodic clock generation component and a control terminal of the second pull-up transistor, the edge enhancement unit being configured to receive the clock signal and a first signal inputted externally and generate an edge enhancement signal based on the clock signal and the first signal, and the edge enhancement signal being configured to control ON/OFF of the second pull-up transistor.

Details of one or more embodiments of the present disclosure are set forth in the following accompanying drawings and descriptions. Other features, objectives and advantages of the present disclosure become obvious with reference to the specification, the accompanying drawings, and the claims.

BRIEF DESCRIPTION OF DRAWINGS

In order to better describe and illustrate embodiments of the present disclosure, reference may be made to one or more accompanying drawings. Additional details or examples used to describe the accompanying drawings should not be considered as limitations on the scope of any of the invention-creations, the embodiments described hereinafter, and the preferred embodiments of the present disclosure.

DETAILED DESCRIPTION

Figure 1:
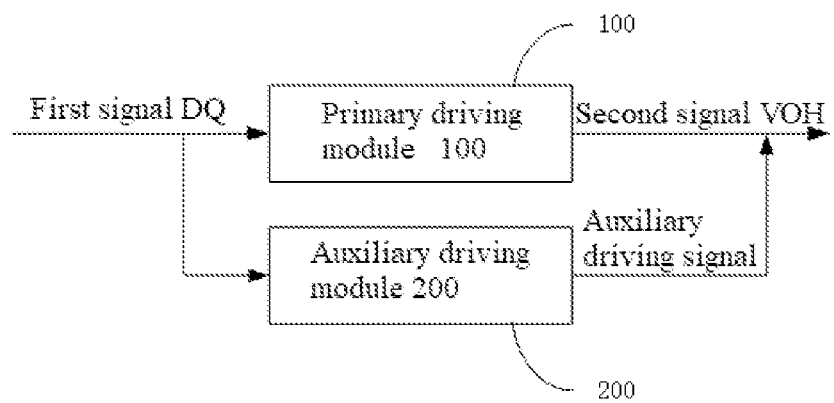
FIG. 1 is a schematic structural diagram of a driving circuit according to an embodiment.

For easy understanding of the embodiments of the present disclosure, a more comprehensive description of the embodiments of the present disclosure will be given below with reference to the relevant accompanying drawings. Preferred embodiments of the embodiments of the present disclosure are given in the drawings. However, the embodiments of the present disclosure may be implemented in many different forms and is not limited to the embodiments described herein. Rather, these embodiments are provided to make the contents disclosed in the embodiments of the present disclosure more thorough and comprehensive.

Unless defined otherwise, all technical and scientific terms used herein have the same meanings as are commonly understood by those skilled in the art. The terms used herein in the specification of the embodiments of the present disclosure are for the purpose of describing specific embodiments only but not intended to limit the embodiments of the present disclosure. The term "and/or" used herein includes any and all combinations of one or more related listed items.

In a memory device, a transmission speed can be increased by driving a data signal through a driving circuit. However, limited by power consumption of the memory, driving capability of an existing driving circuit may not meet the rapid development of use requirements.

FIG. 1 is a schematic structural diagram of a driving circuit according to an embodiment. Referring to FIG. 1, in this embodiment, the driving circuit includes a primary driving module 100 and an auxiliary driving module 200.

The primary driving module 100 is configured to receive a first signal DQ and generate a second signal VOH based on the first signal DQ. Driving capability of the second signal VOH is greater than that of the first signal DQ. The primary driving module 100 is configured to acquire a data signal from a logic circuit, process the acquired data signal, and transmit a processed signal to a controller through a signal channel, so as to realize transmission of the data signal. In this embodiment, the first signal DQ is the data signal acquired from the logic circuit by the primary driving module 100, and the second signal VOH is the signal processed and sent to the signal channel by the primary driving module 100. By processing the first signal DQ through the primary driving module 100, the driving circuit according to this embodiment can obtain the second signal VOH with greater driving capability, thereby effectively increasing a signal transmission speed.

Illustratively, a memory device can be a dynamic random-access memory (DRAM) or a static random-access memory (SRAM), which may specifically be, for example, a DRAM, an SRAM, a transistor RAM (TRAM), a zero RAM (Z-RAM), a twin transistor RAM (TTRAM), an MRAM, or the like of a low power DDR4 (LPDDR4) or LPDDR4X memory.

The auxiliary driving module 200 is connected to an output terminal of the primary driving module 100 and configured to receive the first signal DQ and generate an auxiliary driving signal based on the first signal DQ. The auxiliary driving signal is configured to shorten a rise time of the second signal VOH.

The various circuits, device components, modules, units, blocks, or portions may have modular configurations, or are composed of discrete components, but nonetheless can be referred to as "circuits," "components," "modules," "blocks," "portions," or "units" in general. In other words, the "circuits," "components," "modules," "blocks," "portions," or "units" referred to herein may or may not be in modular forms, and these phrases may be interchangeably used.

In some embodiments, the data signal is read and written in response to the clock signal. Therefore, if a rising edge and/or a falling edge of the clock signal arrive/arrives, a to-be-written data signal does not reach a target level, resulting in a data read/write error. For example, if to-be-written data corresponding to an edge time of a current clock signal is 1 and write data at an edge time of a previous clock signal is 0, the second signal VOH is required to be pulled up from a low-level range to a high-level range, for example, pulled up from 0.1 V to 1.1 V, between two adjacent edge times of the clock signal, so as to accurately transmit the second signal VOH. If the second signal VOH does not reach the high-level range when the edge time of the current clock signal arrives, the signal transmitted to the signal channel is a low-level signal. That is, the actual second signal VOH is not accurately transmitted to the signal channel, resulting in a transmission error of the second signal VOH.

Further, the memory is further required to achieve faster read/write and data transmission. For example, an LPDDR is at a data transmission rate of 400 million bits per second (Mbps), an LPDDR2 is at a data transmission rate of 1600 Mbps, an LPDDR3 is at a data transmission rate of 2133 Mbps, an LPDDR4 is at a data transmission rate of 3200 Mbps, and an LPDDR4X is at a data transmission rate of 4.266 Gbps. Obviously, with the continuous improvement of the memory, the data transmission rate is also increasing. In order to realize fast data transmission and read/write, a cycle of a clock signal in the memory is required to be reduced correspondingly. That is, a time interval between two adjacent edges of the clock signal may also be further reduced. If the rise time of the second signal VOH is too long, a timing margin of the data signal may be reduced, thereby limiting the transmission and read/write speeds of the memory. Therefore, a speed at which the second signal VOH switches between the high and low levels is required to be further increased to ensure the correct transmission of the second signal VOH.

In this embodiment, the driving circuit includes: a primary driving module 100 configured to receive a first signal DQ and generate a second signal VOH based on the first signal DQ, driving capability of the second signal VOH being greater than that of the first signal DQ; and an auxiliary driving module 200 connected to an output terminal of the primary driving module 100 and configured to receive the first signal DQ and generate an auxiliary driving signal based on the first signal DQ, the auxiliary driving signal being configured to shorten the rise time of the second signal VOH. The driving capability of the first signal DQ is improved through the primary driving module 100, and the rise time of the second signal VOH is reduced through the cooperation of the auxiliary driving module 200, so that the timing margin of the data signal is improved, so as to realize faster signal transmission.

Figure 2:
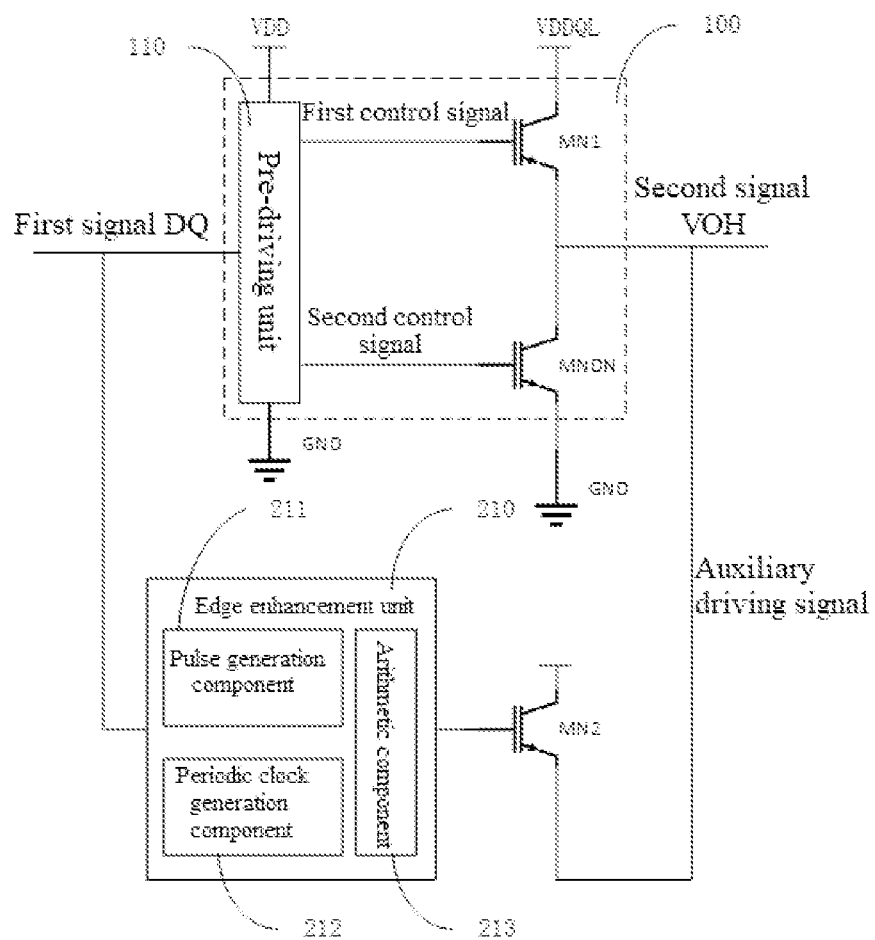
FIG. 2 is a schematic structural diagram of a driving circuit according to another embodiment.

FIG. 2 is a schematic structural diagram of a driving circuit according to another embodiment. Referring to FIG. 2, in this embodiment, the primary driving module 100 includes a first pull-up transistor NM1, a first pull-down transistor MNDN and a pre-driving unit 110.

The first pull-up transistor MN1 and the first pull-down transistor MNDN are configured to generate the second signal VOH together. An output terminal of the first pull-up transistor MN1 and an output terminal of the first pull-down transistor MNDN are connected to each other to output the second signal VOH together. The pre-driving unit 110 is connected to the first pull-up transistor MN1 and the first pull-down transistor MNDN. The pre-driving unit 110 is configured to receive the first signal DQ and control ON/OFF of the first pull-up transistor MN1 and ON/OFF of the second pull-up transistor MN2 based on the first signal DQ.

Specifically, the first pull-up transistor MN1 is configured to pull a voltage of the second signal VOH up to a first preset level. The first preset level falls within the high-level range. The high-level range is, for example, greater than 1 V. The first pull-down transistor MNDN is configured to pull the voltage of the second signal VOH down to a second preset level. The second preset level falls within the low-level range. The low-level range is, for example, less than 0.2 V. Under the control of the pre-driving unit 110, the first pull-up transistor MN1 and the first pull-down transistor MNDN have different pulling capability. The transistor with stronger pulling capability can pull the voltage of the second signal VOH to the corresponding first preset level or second preset level. For example, if the first pull-up transistor MN1 has stronger pulling capability, the voltage of the second signal VOH may be pulled up to the first preset level.

The pre-driving unit 110 generates a first control signal and a second control signal based on the first signal DQ, transmits the first control signal to the first pull-up transistor MN1, and transmits the second control signal to the first pull-down transistor MNDN.

In some examples, the first pull-up transistor MN1 and the first pull-down transistor MNDN may be of the same type. Transistor types include an N type and a P type. When the first pull-up transistor MN1 and the first pull-down transistor MNDN are of the same type, the first pull-up transistor MN1 and the first pull-down transistor MNDN are both turned on at a high level or both turned on at a low level. Therefore, the first pull-up transistor MN1 and the first pull-down transistor MNDN can be controlled by enabling the first control signal and the second control signal to be in opposite level states, for example, enabling the first control signal to be at a high level and the second control signal to be at a low level, so that the two transistors have different pulling capability. Further, the pre-driving unit 110 may be provided with an inverter with an input terminal connected to the first control signal, so as to invert the first control signal to generate the second control signal.

In some other examples, the first pull-up transistor MN1 and the first pull-down transistor MNDN may also be of different types. When the first pull-up transistor MN1 and the first pull-down transistor MNDN are of different types, one of the first pull-up transistor MN1 and the first pull-down transistor MNDN is turned on at a high level, and the other is turned on at a low level. Therefore, the first pull-up transistor MN1 and the first pull-down transistor MNDN can be controlled by enabling the first control signal and the second control signal to be in the same level state, for example, enabling the first control signal and the second control signal to be at a high level, so that the two transistors have different pulling capability, and a control signal generation circuit can be simplified.

In one embodiment, still referring to FIG. 2, the first pull-up transistor MN1 and the first pull-down transistor MNDN are both N-type transistors. Specifically, power consumption is an important reference factor during the design of the driving circuit, and can be estimated with reference to the following formula:

$$P_{out} = \tfrac{1}{2} C_{Load} \times V_{DD} \times V_{swing}$$

where $C_{Load}$ denotes load capacitance, $V_{DD}$ denotes a power supply voltage VDDQL, $V_{swing}$ denotes an output voltage swing, and $P_{out}$ denotes output power. According to the formula, the output power can be reduced when any one of the load capacitance, the power supply voltage VDDQL and the output voltage swing is reduced. In this embodiment, an N-type transistor is used as the first pull-up transistor MN1. The N-type transistor has better load capacitance characteristics than the P-type transistor due to its own structural characteristics. Therefore, the output power consumption of the driving circuit can be effectively reduced by using the N-type transistor.

Compared with the P-type first pull-up transistor MN1, the N-type first pull-up transistor MN1 can transmit a signal at a voltage lower than the power supply voltage VDDQL. Therefore, compared to the driving circuit in which the first pull-up transistor MN1 is a P-type transistor, the driving circuit according to this embodiment can transmit a signal with a smaller output voltage swing than the driving circuit in which the first pull-up transistor MN1 is a P-type transistor. For example, the LPDDR4X has an output voltage swing of 0.366 V, and the LPDDR4 has an output voltage swing of 0.3 V. Therefore, the LPDDR4X using the N-type first pull-up transistor MN1 can reduce the power consumption by about 20% compared to the LPDDR4. In addition, compared to the P-type transistor, a size of the primary driving module 100 can be effectively reduced by using the N-type transistor as the first pull-up transistor MN1. Furthermore, symmetry characteristics of the first pull-up transistor MN1 and the first pull-down transistor MNDN can be improved by enabling the first pull-up transistor MN1 and the first pull-down transistor MNDN to be the same N-type transistor, so as to further improve the performance of the driving circuit.

In one embodiment, a drain of the first pull-up transistor MN1 is connected to the power supply voltage VDDQL, a source of the first pull-up transistor MN1 is connected to a drain of the first pull-down transistor MNDN, and a source of the first pull-down transistor MNDN is connected to a ground voltage GND. The source of the first pull-up transistor MN1 and the drain of the first pull-down transistor MNDN are configured to output the second signal VOH together.

Specifically, in this embodiment, the first preset level is the power supply voltage VDDQL, and the second preset level is the ground voltage GND. When the first control signal is at a high level and the second control signal is at a low level, the first pull-up transistor MN1 is turned on, the first pull-down transistor MNDN is turned off, and the second signal VOH is pulled up to the power supply voltage VDDQL. When the first control signal is at a low level and the second control signal is at a low level, the first pull-up transistor MN1 is turned off, the first pull-down transistor MNDN is turned on, and the second signal VOH is pulled down to the ground voltage GND. Further, through the cooperation of the auxiliary driving module 200, this embodiment can reduce the rise time when the second signal VOH switches from a low level to a high level, so as to enlarge a signal timing margin to provide a more reliable and faster output signal.

In one embodiment, still referring to FIG. 2, the auxiliary driving module 200 includes a second pull-up transistor MN2 and an edge enhancement unit 210.

The second pull-up transistor MN2 is configured to generate the auxiliary driving signal. The auxiliary driving signal may be, for example, a charging current. That is, the auxiliary driving module 200 is configured to generate a charging current based on the first signal DQ. The charging current is configured to speed up the charging of the second signal VOH to reduce the rise time of the second signal VOH. When the second signal VOH is required to switch from a low level to a high level, the auxiliary driving module 200 is required to be turned on; that is, the second pull-up transistor MN2 is controlled to be turned on by the edge enhancement unit 210, so that the second pull-up transistor MN2 outputs the charging current to the primary driving module 100. The charging current can speed up the charging of the output terminal of the primary driving module 100, thereby reducing the rise time of the second signal VOH.

Specifically, the second pull-up transistor MN2 is an N-type transistor, a control terminal of the second pull-up transistor MN2 is connected to the edge enhancement unit 210, a drain of the second pull-up transistor MN2 is connected to the power supply voltage VDDQL, and a source of the second pull-up transistor MN2 is configured to output the auxiliary driving signal. That is, both the second pull-up transistor MN2 and the first pull-up transistor MN1 are connected to the power supply voltage VDDQL. Therefore, when the second pull-up transistor MN2 is turned on, a voltage of the output terminal of the primary driving module 100 may rise rapidly to a high level, thereby reducing the rise time of the second signal VOH. Similar to the first pull-up transistor MN1, the N-type second pull-up transistor MN2 can transmit a signal at a voltage lower than the power supply voltage VDDQL. The driving circuit according to this embodiment can transmit a signal with a smaller output voltage swing than the driving circuit in which the second pull-up transistor MN2 is a P-type transistor. For example, the LPDDR4X has an output voltage swing of 0.366 V, and the LPDDR4 has an output voltage swing of 0.3 V. Therefore, the LPDDR4X can reduce the power consumption by about 20% compared to the LPDDR4. In addition, compared to the P-type transistor, a size of the auxiliary driving module 200 can be effectively reduced by using the N-type transistor as the second pull-up transistor MN2.

The edge enhancement unit 210 is connected to a control terminal of the second pull-up transistor MN2 and configured to receive the first signal DQ and generate an edge enhancement signal based on the first signal DQ. The edge enhancement signal is configured to control ON/OFF of the second pull-up transistor MN2. The edge enhancement signal acts as an enable signal to control the second pull-up transistor MN2. The edge enhancement signal includes a high level and a low level. That is, when the signal is in a high-level stage, the second pull-up transistor MN2 is controlled to be turned on to output the auxiliary driving signal, so as to speed up the switching of the second signal VOH from a low level to a high level. When the signal is in a low-level stage, the second pull-up transistor MN2 is controlled to be turned off and does not output the auxiliary driving signal.

In one embodiment, the edge enhancement unit 210 includes a pulse generation component 211, a periodic clock generation component 212 and an arithmetic component 213.

Figure 3:
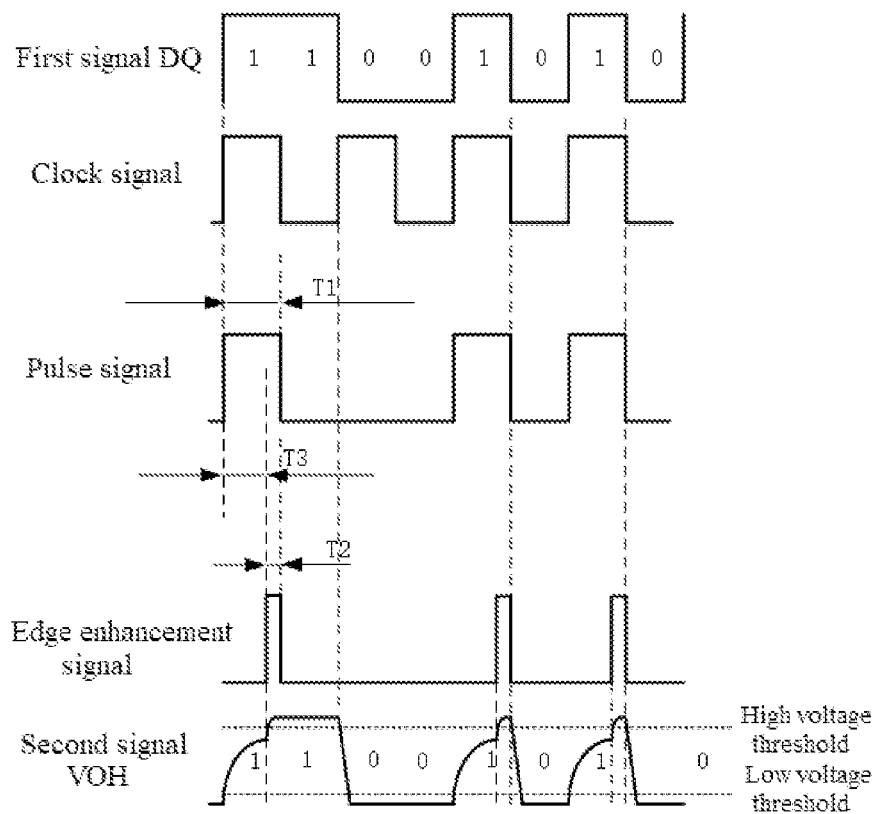
FIG. 3 is a signal timing diagram according to an embodiment.

Specifically, the pulse generation component 211 is configured to receive the first signal DQ and generate a pulse signal based on the first signal DQ. The periodic clock generation component 212 is configured to generate a clock signal. The arithmetic component 213 is connected to the pulse generation component 211 and the periodic clock generation component 212. The arithmetic component 213 is configured to generate the edge enhancement signal based on the pulse signal and the clock signal. The clock signal may also come from outside the edge enhancement unit 210. The periodic clock generation component 212 can be inactive or only plays a delaying role. FIG. 3 is a signal timing diagram according to an embodiment. Referring to FIG. 3, a cycle of the clock signal is matched with a cycle of data update of the first signal DQ, so as to ensure the accuracy of signal read/write timing.

Further, the pulse generation component 211 responds to a rising edge of the first signal DQ and generates the pulse signal. The clock signal is configured with a preset clock cycle, and a width of a high level of the pulse signal is less than or equal to half of the clock cycle. For example, as shown in FIG. 3, the width of the high level of the pulse signal is equal to a width of a high level of the clock signal. It may be understood that the influence of the pulse signal maintained at a high level on the power consumption of the driving circuit is higher than that of the pulse signal maintained at a low level on the power consumption of the driving circuit. Therefore, on the premise of ensuring accurate signal transmission, better power performance can be achieved by narrowing the width of the high level of the pulse signal. Specifically, an appropriate width of the high level can be selected according to a signal timing margin and a power consumption requirement. For example, the width of the high level of the pulse signal may be ⅓, ¼, etc. of the clock cycle. Further, the second signal VOH cannot be accurately driven based on the pulse signal when the width of the high level of the pulse signal generated by the pulse generation component 211 is greater than half of the clock cycle. It may be understood that the periodic clock generation component 212 has better stability than the pulse generation component 211. Therefore, the operation unit 213 can choose to output a clock signal to ensure the accurate signal driving when the high level width of the pulse signal does not meet the requirement.

Figure 4:
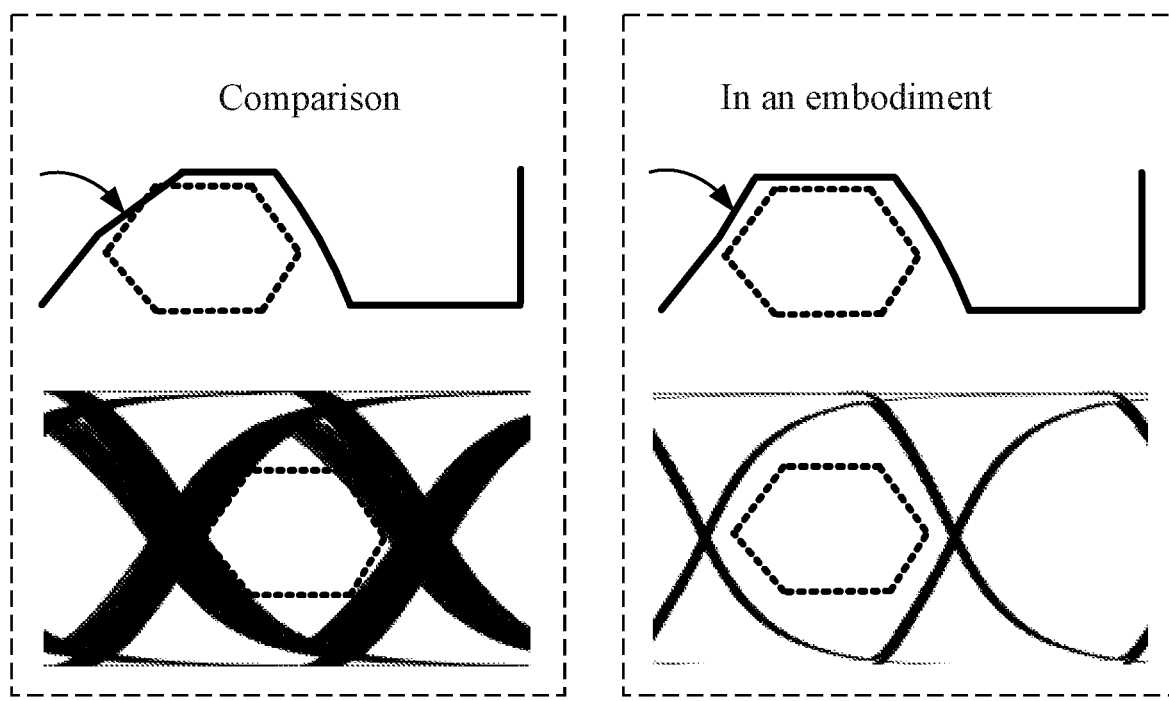
FIG. 4 is a diagram showing comparisons of eye pattern test results of a second signal.

FIG. 4 is a diagram showing comparisons of eye pattern test results of a second signal VOH. Referring to FIG. 4, two test patterns on the left are test results of the second signal VOH in a case where a comparison driving circuit is used. Due to the insufficient rising speed of the second signal VOH at the position pointed by the arrow in the upper left test pattern, the rise time of the second signal VOH is too long, thereby leading to serious noise. That is, the lower left eye pattern test results are not open enough, and the signal timing margin is low. Two test patterns on the right are test results of the second signal VOH in a case where the driving circuit according to this embodiment is used. Due to the obviously increased rising speed of the second signal VOH at the position pointed by the arrow in the upper right test pattern, noise in the lower right eye pattern test results is reduced and the signal timing margin is increased.

In one embodiment, a width of a high level of the edge enhancement signal is less than or equal to a width of a high level of the pulse signal. Still referring to FIG. 3, in the embodiment shown in FIG. 3, the width T2 of the high level of the edge enhancement signal is less than the width of the high level T1 of the pulse signal. A rising edge of the edge enhancement signal is delayed for a time T3 compared to a rising edge of the pulse signal, and a falling edge of the edge enhancement signal is substantially aligned with a falling edge of the pulse signal (there may be several logic-gate delays in a real circuit).

Figure 5:
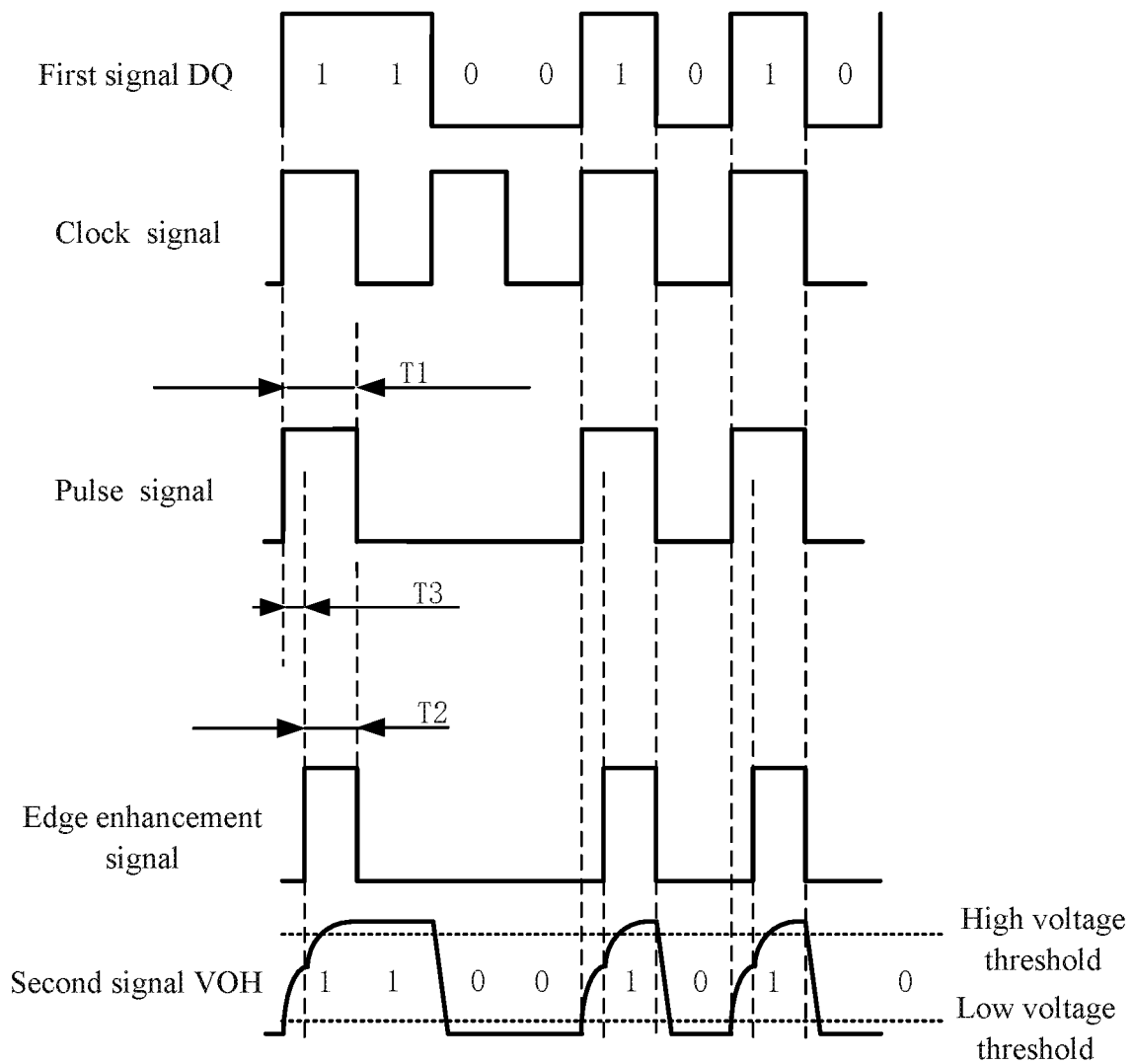
FIG. 5 is a signal timing diagram according to another embodiment.

FIG. 5 is a signal timing diagram according to another embodiment. The width T2 of the high level of the edge enhancement signal in the embodiment shown in FIG. 5 is wider than the width T2 of the high level of the edge enhancement signal shown in FIG. 3; that is, the delay time T3 is adjustable. The arithmetic component 213 may include a multiplexer. The multiplexer is connected to the pulse generation component 211 and the periodic clock generation component 212, and the multiplexer chooses to output the pulse signal, so that the width of the high level of the edge enhancement signal can be equal to or less than the width of the high level of the pulse signal. At the same time, the rising edge of the edge enhancement signal can be controlled to delay for a certain time, for example, the delay time T3 in FIG. 3 and FIG. 5, compared to the rising edge of the pulse signal, and a falling edge of the edge enhancement signal can also be controlled to be substantially aligned with a falling edge of the pulse signal.

Referring to FIG. 2, FIG. 3 and FIG. 4 together, the edge enhancement signal is generated only when the second signal VOH is close to a high voltage threshold stage. Limited by the NMOS transistor driving structure used in FIG. 2, a pull-up effect of the MN1 transistor on the second signal VOH becomes weak when the second signal VOH rises close to the high voltage threshold stage, resulting in a slow rising speed of the second signal VOH at the high voltage threshold stage. In this case, the edge enhancement signal causes the MN2 transistor to be turned on, and the MN1 transistor and the MN2 transistor pull up the second signal VOH together, which can accelerate the rising of the second signal VOH. In fact, the pull-up effect of the MN1 transistor on the second signal VOH becomes weaker and weaker as the second signal VOH rises. If the edge enhancement signal causes the MN2 transistor to be turned on earlier, the second signal VOH can rise faster beyond the high voltage threshold, but this also consumes more power. Therefore, the rising speed of the second signal VOH and the power consumption should be considered when a pulse rising edge of the edge enhancement signal generated by the edge enhancement unit arrives.

In one embodiment, the edge enhancement signal includes a plurality of enhanced pulses, the pulse signal includes a plurality of initial pulses, the enhanced pulses are in one-to-one correspondence to the initial pulses, and a falling edge of the enhanced pulse is aligned with a falling edge of the corresponding initial pulse. Specifically, in the embodiment shown in FIG. 3, the edge enhancement signal includes three enhanced pulses, the pulse signal includes three initial pulses, and the first enhanced pulse corresponds to the first initial pulse, the second enhanced pulse corresponds to the second initial pulse, and the third enhanced pulse corresponds to the third initial pulse. The timing accuracy of the edge enhancement signal can be improved by aligning the falling edge of the enhanced pulse with the falling edge of the corresponding initial pulse.

In one embodiment, a rising edge of the enhanced pulse is delayed for a preset time period compared to a rising edge of the corresponding initial pulse. The preset time period is the time T3 shown in the embodiment of FIG. 3. In this embodiment, the generation time of the auxiliary driving signal can be controlled by delaying the edge enhancement signal, so that the timing of the auxiliary driving signal is matched with that of the second signal VOH, so as to achieve a better driving effect.

Figure 6:
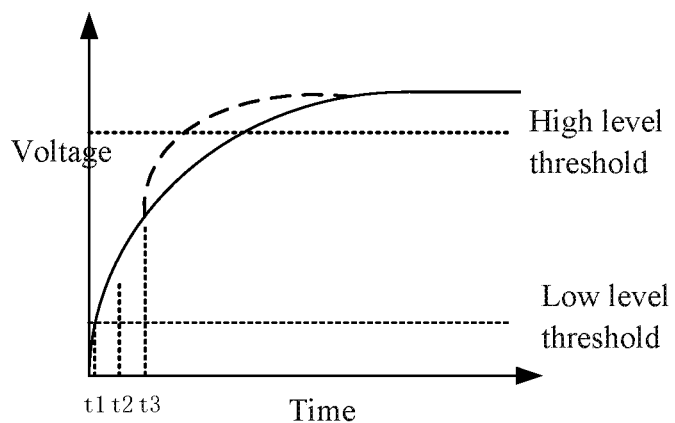
FIG. 6 is a graph of voltage of the second signal versus time according to an embodiment.

FIG. 6 is a graph of voltage of the second signal VOH versus time according to an embodiment. FIG. 6 shows voltage changes during the switching of the second signal VOH from a low level to a high level. The solid line in FIG. 6 shows a curve of the second signal VOH outputted from comparison driving circuit, and the dashed line in FIG. 6 shows a curve of the second signal VOH outputted from the driving circuit according to this embodiment. Referring to FIG. 6, at an early stage of the switching of the second signal VOH from the low level to the high level, the voltage rises faster, and the rising of the voltage gradually slows down with the constant increase in the voltage of the second signal VOH. It may be understood that, if the auxiliary driving signal is outputted in a time period when the voltage of the second signal VOH rises faster, it has little improvement effect on the rising speed of the voltage of the second signal VOH. Therefore, this embodiment can make the auxiliary driving signal arrive at the output terminal of the second signal VOH at an appropriate time, so as to achieve a better effect of improving the rise time of the second signal VOH with lower energy consumption.

Further, in an example where the auxiliary driving signal is a charging current, a generation time of the charging current is equal to or later than a first time. The first time may be, for example, a time at which a voltage of the second signal VOH rises to a low level threshold. The first time is the time t1 in FIG. 6. Power consumption of the driving circuit can be reduced by making the generation time of the charging current equal to or later than the first time. Furthermore, the generation time of the charging current may be, for example, a time t2, a time t3, or the like. An appropriate generation time can be specifically selected according to the driving capability of the first pull-up transistor MN1 and the first pull-down transistor MNDN. FIG. 6 illustrates that an auxiliary charging current is generated from the time t3.

Figure 7:
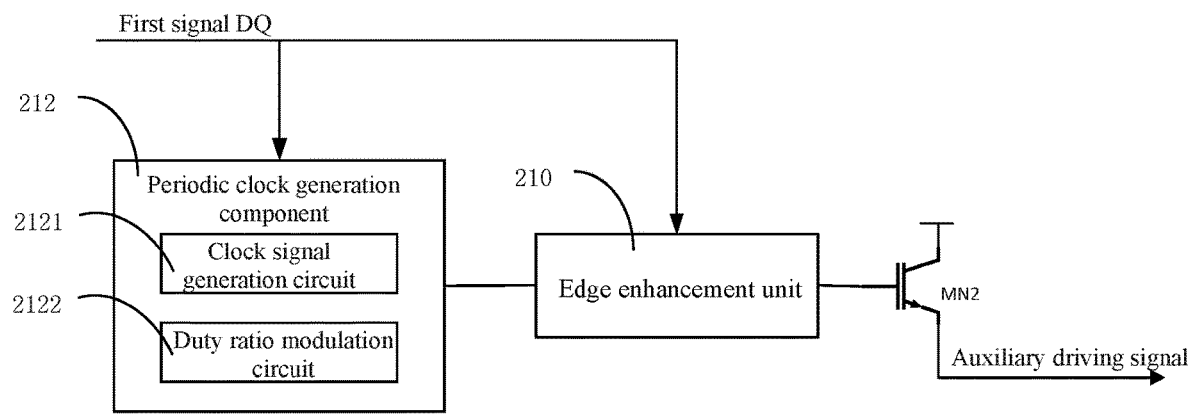
FIG. 7 is a schematic structural diagram of a driving circuit according to yet another embodiment.

FIG. 7 is a schematic structural diagram of a driving circuit according to yet another embodiment. Referring to FIG. 7, in this embodiment, the driving circuit includes a second pull-up transistor MN2, a periodic clock generation component 212 and an edge enhancement unit 210.

The second pull-up transistor MN2 is configured to generate an auxiliary driving signal and output the auxiliary driving signal to a primary driving module 100. The auxiliary driving signal is configured to shorten the rise time of an output signal of the primary driving module 100. The periodic clock generation component 212 is configured to generate a clock signal with a duty ratio of 50%. The edge enhancement unit 210 is connected to the periodic clock generation component 212 and a control terminal of the second pull-up transistor MN2. The edge enhancement unit 210 is configured to receive the clock signal and a first signal DQ inputted externally and generate an edge enhancement signal based on the clock signal and the first signal DQ. The edge enhancement signal is configured to control ON/OFF of the second pull-up transistor. It may be understood that in a DDR memory, both rising and falling edges of the clock signal are required to be configured for data read and write and transmission. However, changes in a manufacturing process, a temperature and other parameters may lead to a decrease in the duty ratio of the clock signal, thereby resulting in signal jitter. Therefore, the corresponding signal jitter can be avoided by making the duty ratio of the clock signal 50%, so as to improve the reliability of the clock signal.

In one embodiment, the periodic clock generation component 212 includes a clock signal generation circuit 2121 and a duty ratio modulation circuit 2122. The clock signal generation circuit 2121 is configured to generate a clock signal configured with a preset clock cycle. The duty ratio modulation circuit 2122 is connected to the clock signal generation circuit 2121 and configured to modulate the clock signal so that the duty ratio of the clock signal is 50%.

Figure 8:
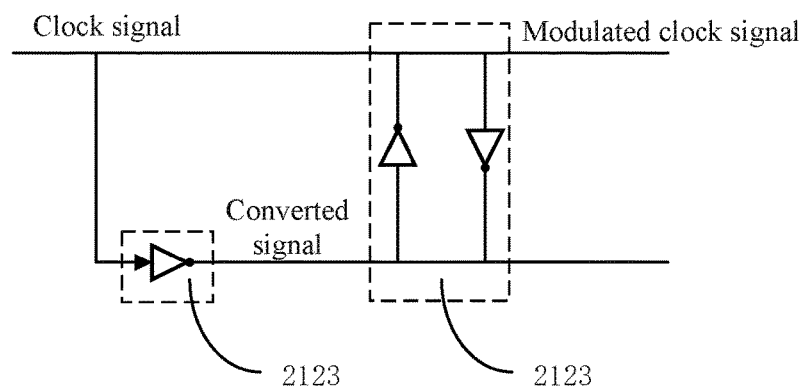
FIG. 8 is a schematic structural diagram of a duty ratio modulation circuit according to an embodiment.

Further, FIG. 8 is a schematic structural diagram of a duty ratio modulation circuit 2122 according to an embodiment. Referring to FIG. 8, in this embodiment, the duty ratio modulation circuit 2122 includes a phase converter 2123 and a cross-coupled latch 2124. The phase converter 2123 is connected to the clock signal generation circuit 2121 and configured to receive the clock signal and convert a phase of the clock signal to generate a converted signal. A phase difference between the converted signal and the clock signal is 180°. The cross-coupled latch 2124 is connected to the phase converter 2123 and configured to receive the clock signal and the converted signal and modulate the duty ratio based on the clock signal and the converted signal so that the duty ratio of the clock signal is 50%. Illustratively, the cross-coupled latch 2124 includes two anti-parallel inverters. In this embodiment, through the cooperation between the phase converter 2123 and the cross-coupled latch 2124, the duty ratio of the clock signal can be modulated with a simpler circuit structure, so that the jitter of the clock signal can be improved, thereby obtaining a wider timing margin.

Technical features of the above embodiments may be combined in various ways. To make descriptions brief, not all possible combinations of the technical features in the embodiments are described. Therefore, as long as there is no contradiction between the combinations of the technical features, they should all be considered as scopes disclosed in the specification.

The above embodiments merely describe several implementations of the embodiments of the present disclosure, and their description is specific and detailed, but cannot therefore be understood as a limitation on the patent scope of the present disclosure. It should be noted that those of ordinary skill in the art may further make variations and improvements without departing from the conception of the embodiments of the present disclosure, and these all fall within the protection scope of the embodiments of the present disclosure. Therefore, the patent protection scope of the embodiments of the present disclosure should be subject to the appended claims.

What is claimed is:

1. A driving circuit, comprising:
   a primary driving module configured to receive a first signal and generate a second signal based on the first signal, driving capability of the second signal being greater than that of the first signal; and
   an auxiliary driving module connected to an output terminal of the primary driving module and configured to receive the first signal and generate an auxiliary driving signal based on the first signal, the auxiliary driving signal being configured to shorten a rise time of the second signal;
wherein the auxillary driving module comprises:
a second pull-up transistor configured to generate the auxillary driving signal; and
an edge enhancement unit connected to a control terminal of the second pull-up transistor and configured to receive the first signal and generate an edge enhancement signal based on the first signal, the edge enhancement signal being configured to control ON/OFF of the second pull-up transistor.

2. The driving circuit according to claim 1, wherein the primary driving module comprises:
a first pull-up transistor;
a first pull-down transistor; and
a pre-driving unit connected to the first pull-up transistor and the first pull-down transistor, the pre-driving unit being configured to receive the first signal and control ON/OFF of the first pull-up transistor and ON/OFF of the second pull-up transistor based on the first signal;
wherein the first pull-up transistor and the first pull-down transistor are configured to generate the second signal together, and an output terminal of the first pull-up transistor and an output terminal of the first pull-down transistor are connected to each other to output the second signal together.

3. The driving circuit according to claim 2, wherein the first pull-up transistor and the first pull-down transistor are both N-type transistors.

4. The driving circuit according to claim 3, wherein a drain of the first pull-up transistor is connected to a power supply voltage, a source of the first pull-up transistor is connected to a drain of the first pull-down transistor, and a source of the first pull-down transistor is connected to a ground voltage;
wherein the source of the first pull-up transistor and the drain of the first pull-down transistor are configured to output the second signal together.

5. The driving circuit according to claim 1, wherein the second pull-up transistor is an N-type transistor.

6. The driving circuit according to claim 5, wherein the control terminal of the second pull-up transistor is connected to the edge enhancement unit, a drain of the second pull-up transistor is connected to a power supply voltage, and a source of the second pull-up transistor is configured to output the auxiliary driving signal.

7. The driving circuit according to claim 1, wherein the edge enhancement unit comprises:
a pulse generation component configured to receive the first signal and generate a pulse signal based on the first signal;
a periodic clock generation component configured to generate a clock signal; and
an arithmetic component connected to the pulse generation component and the periodic clock generation component, the arithmetic component being configured to generate the edge enhancement signal based on the pulse signal and the clock signal.

8. The driving circuit according to claim 7, wherein the pulse generation component responds to a rising edge of the first signal and generates the pulse signal;
wherein the clock signal is configured with a preset clock cycle, and a width of a high level of the pulse signal is less than or equal to half of the clock cycle.

9. The driving circuit according to claim 7, wherein a width of a high level of the edge enhancement signal is less than or equal to a width of a high level of the pulse signal.

10. The driving circuit according to claim 7, wherein the edge enhancement signal comprises a plurality of enhanced pulses, the pulse signal comprises a plurality of initial pulses, the enhanced pulses are in one-to-one correspondence to the initial pulses, and a rising edge of the enhanced pulse is delayed for a preset time period compared to a rising edge of the corresponding initial pulse.

11. The driving circuit according to claim 7, wherein the edge enhancement signal comprises a plurality of enhanced pulses, the pulse signal comprises a plurality of initial pulses, the enhanced pulses are in one-to-one correspondence to the initial pulses, and a falling edge of the enhanced pulse is aligned with a falling edge of the corresponding initial pulse.

12. The driving circuit according to claim 1, wherein the auxiliary driving module is configured to generate a charging current based on the first signal, the charging current being configured to accelerate a charging speed of the second signal to reduce the rise time of the second signal.

13. The driving circuit according to claim 12, wherein a generation time of the charging current is equal to or later than a first time;
wherein the first time is a time at which a voltage of the second signal rises to a low level threshold.

14. A driving circuit, comprising:
a second pull-up transistor configured to generate an auxiliary driving signal and output the auxiliary driving signal to a primary driving module, the auxiliary driving signal being configured to shorten a rise time of an output signal of the primary driving module;
a periodic clock generation component configured to generate a clock signal with a duty ratio of 50%; and
an edge enhancement unit connected to the periodic clock generation component and a control terminal of the second pull-up transistor, the edge enhancement unit being configured to receive the clock signal and a first signal inputted externally and generate an edge enhancement signal based on the clock signal and the first signal, and the edge enhancement signal being configured to control ON/OFF of the second pull-up transistor.

15. The driving circuit according to claim 14, wherein the periodic clock generation component comprises:
a clock signal generation circuit configured to generate a clock signal configured with a preset clock cycle; and
a duty ratio modulation circuit connected to the clock signal generation circuit and configured to modulate the clock signal so that the duty ratio of the clock signal is 50%.

16. The driving circuit according to claim 14, wherein the duty ratio modulation circuit comprises:
a phase converter connected to the clock signal generation circuit and configured to receive the clock signal and convert a phase of the clock signal to generate a converted signal, a phase difference between the converted signal and the clock signal being 180°; and
a cross-coupled latch connected to the phase converter and configured to receive the clock signal and the converted signal and modulate the duty ratio based on the clock signal and the converted signal so that the duty ratio of the clock signal is 50%.

* * * * *